United States Patent
Belikoff et al.

(10) Patent No.: US 8,482,163 B2
(45) Date of Patent: Jul. 9, 2013

(54) INVERTER COOLER

(75) Inventors: Michael A. Belikoff, Mendham, NJ (US); Thomas Kuster, Clinton, NJ (US); Christopher Thompson, Narragansett, RI (US)

(73) Assignee: First Solar, Inc., Perrysburg, OH (US)

(*) Notice: Subject to any disclaimer, the term of this patent is extended or adjusted under 35 U.S.C. 154(b) by 483 days.

(21) Appl. No.: 12/722,027

(22) Filed: Mar. 11, 2010

(65) Prior Publication Data

US 2010/0302731 A1 Dec. 2, 2010

Related U.S. Application Data

(60) Provisional application No. 61/178,802, filed on May 15, 2009.

(51) Int. Cl.
*G05F 3/06* (2006.01)

(52) U.S. Cl.
USPC ....... 307/151; 361/691; 361/695; 361/679.46

(58) Field of Classification Search
USPC ................ 307/65, 66, 151; 363/34, 37, 55, 363/98, 109, 133–134, 141; 361/691, 695, 361/679.46, 679.48, 697, 390, 807, 103, 361/676; 700/297
See application file for complete search history.

(56) References Cited

U.S. PATENT DOCUMENTS

| | | | |
|---|---|---|---|
| 4,471,422 A * | 9/1984 | Hierholzer, Jr. | 363/56.08 |
| 5,170,336 A * | 12/1992 | Getter et al. | 363/141 |
| 6,093,885 A * | 7/2000 | Takehara et al. | 136/244 |
| 6,233,149 B1 * | 5/2001 | Bailey et al. | 361/704 |
| 6,428,918 B1 * | 8/2002 | Fuglevand et al. | 429/431 |
| 7,023,712 B2 * | 4/2006 | Miettinen | 363/34 |
| 7,345,561 B2 * | 3/2008 | Meyer et al. | 336/61 |
| 7,538,426 B2 * | 5/2009 | Yamabuchi et al. | 257/714 |
| 2003/0060900 A1 * | 3/2003 | Lo et al. | 700/19 |
| 2005/0116671 A1 * | 6/2005 | Minami et al. | 318/275 |
| 2006/0017328 A1 * | 1/2006 | Bryde | 307/64 |
| 2006/0158037 A1 * | 7/2006 | Danley et al. | 307/64 |
| 2007/0252716 A1 * | 11/2007 | Burger | 340/635 |
| 2009/0078304 A1 * | 3/2009 | Gilmore et al. | 136/248 |
| 2009/0236916 A1 * | 9/2009 | Nishimura | 307/80 |
| 2010/0223941 A1 * | 9/2010 | Shah et al. | 62/229 |

OTHER PUBLICATIONS

PV GAP, PVRS 8A, Sep. 2002, Annex—Specification and testing procedure, to PVRS 8, pp. 1-12.*

* cited by examiner

*Primary Examiner* — Jared J. Fureman
*Assistant Examiner* — Alfonso Perez Borroto
(74) *Attorney, Agent, or Firm* — Dickstein Shapiro LLP

(57) ABSTRACT

A DC to AC inverter used in a solar cell power system can include an improved structure for cooling itself and increasing power output.

20 Claims, 5 Drawing Sheets

INVERTER COOLER

CLAIM FOR PRIORITY

This application claims priority under 35 U.S.C. §119(e) to Provisional U.S. Patent Application Ser. No. 61/178,802 filed on May 15, 2009, which is hereby incorporated by reference.

TECHNICAL FIELD

This invention relates to a DC to AC inverter used in a solar cell power system having improved structure for cooling itself and increasing power output.

BACKGROUND

A solar module-based power system uses an inverter to convert direct current (DC) from a photovoltaic array into alternating current (AC) for use with home appliances or possibly a utility grid.

DETAILED DESCRIPTION

Figure 1:
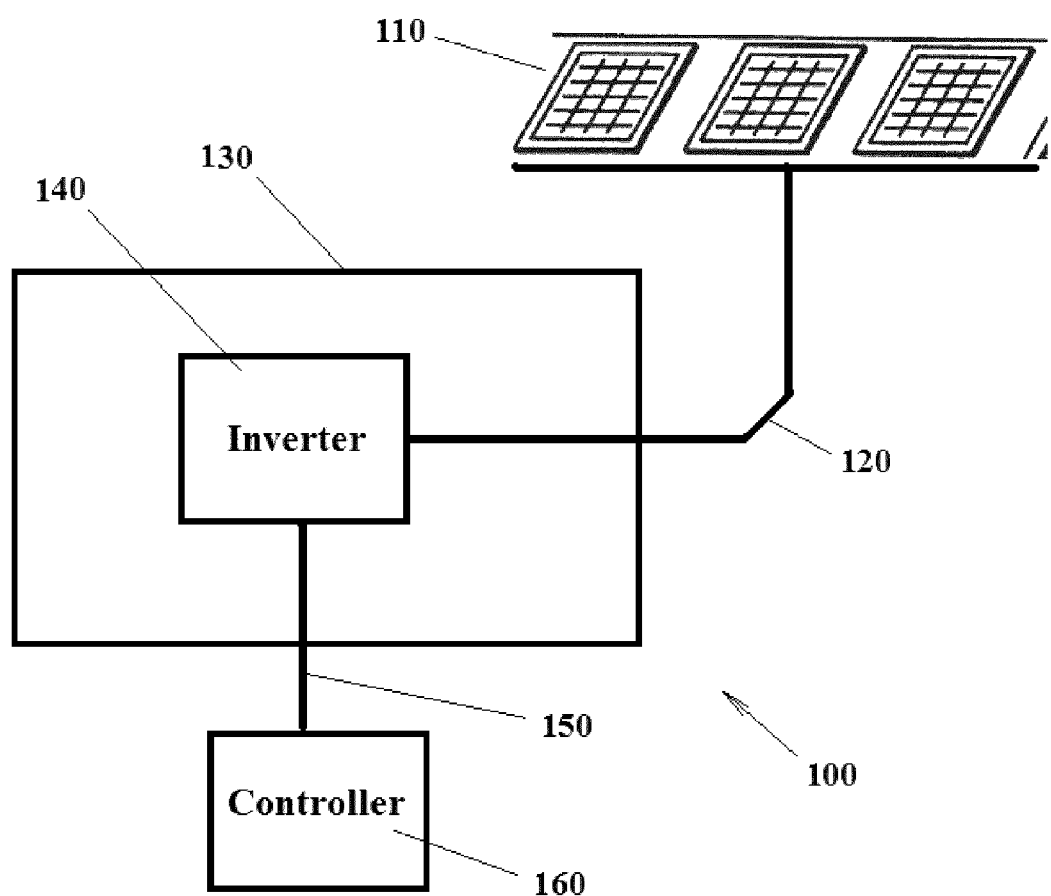
FIG. 1 is a block diagram illustrating the connection of parts in the solar power system.

An inverter can be used in a solar module-based power system to convert direct current (DC) from a photovoltaic array into alternating current (AC) for use with home appliances or an alternating-current utility grid. Inverters are rated for operation at a temperature point (typically 50 degrees C.). Operating temperature can be optimized to provide even better performance that that obtained at the rated temperature, to increase the current capabilities of a given inverter. A DC to AC inverter unit having a self-contained and controlled environment is described. With improved structure for cooling the inverter, an improvement in the power output capabilities can be achieved. The invention will not only reduce the cost of inverters but also lower the balance of system costs in other areas like the number of inverter enclosures and AC cabling.

In one aspect, a DC to AC inverter unit can include an enclosure, and a DC to AC inverter within the enclosure. The inverter can have a rated power output at a first temperature disposed within the container. The DC to AC inverter unit can include a cooling source in thermal communication with the inverter. The inverter can be maintained at a second temperature sufficient to allow the inverter to be overdriven to increase power output by at least 5% over the rated power output. The DC to AC inverter unit can include a power current switch within the enclosure. The switch can switch back and forth to allow current to flow in two alternate directions. The DC to AC inverter unit can include a transformer within the enclosure and electrically connected to the switch. The DC to AC inverter can include at least one cooling air outlet through the enclosure. The DC to AC inverter unit can include at least one cooling air inlet opening through the enclosure. The DC to AC inverter unit can include a cooling air fan connected to the cooling air inlet opening. The cooling air fan can move cooling air from the cooling source into the enclosure through the cooling air inlet opening. The power transformer can include a metal core.

The DC to AC inverter unit can include a cooling air passageway through the interior of the transformer metal core and a transformer cooling air port to allow air to flow through the transformer cooling air passageway. The DC to AC inverter unit can include a smoke detector within the enclosure. The DC to AC inverter unit can include a fused heavy-duty safety disconnect switch within the enclosure. The DC to AC inverter unit can include a non-fused heavy-duty safety disconnect switch within the enclosure. The DC to AC inverter unit can include a ground fault circuit interrupter within the enclosure. The DC to AC inverter unit can include a DC input from a photovoltaic array to the DC to AC inverter. The DC to AC inverter unit can include a supervisory control and data acquisition system within the enclosure. The supervisory control and data acquisition system can include at least one sensor acquiring data on the outputs of the photovoltaic array, a human-machine interface, a current/voltage control unit, a computer supervisory system acquiring data from the sensor and sending commands to the current/voltage control unit, a remote terminal unit connecting to the sensor, converting sensor signals to digital data and sending digital data to the supervisory system, and a communication infrastructure connecting the supervisory system to the remote terminal unit. The supervisory control and data acquisition system can include a programmable logic controller used as field device. The DC to AC inverter unit can include at least one opening for cable routing through the enclosure. The DC to AC inverter unit can include a cable vault adjacent to the enclosure. The cooling source can include an air conditioning system to keep the temperature in the enclosure below about 50 degrees C. The air conditioning system can keep the temperature in the enclosure below about 35 degrees C. The air conditioning system keeps the temperature in the enclosure below about 20 degrees C.

In one aspect, a method for operating a DC to AC inverter unit to generate AC power can include enclosing in an enclosure an inverter having a rated power output. The inverter can include a power current switch which can be electrically connected to a power transformer. The method can include overdriving the inverter to output power greater than the rated power output. The inverter can be thermally connected to a cooling source such as an air conditioning unit to permit the overdriving of the inverter. The cooling source can maintain a temperature in the enclosure below about 50 degrees C. The cooling source can maintain a temperature in the enclosure below about 35 degrees C. The cooling source can maintain a temperature in the enclosure below about 20 degrees C.

The step of thermally connecting a cooling source can include thermally connecting an air conditioning system. The method can include the step of positioning the cooling source outside an enclosure. The step of thermally connecting a cooling source can include connecting the cooling source using a cooling air inlet. The step of connecting the cooling source using a cooling air inlet can include using a cooling air fan to move air through the cooling air inlet. The method can include controlling the cooling source with a programmable controller.

In one aspect, a photovoltaic module-based power system can include a photovoltaic array and a DC to AC inverter unit electrically connected to the photovoltaic array including an enclosure and a DC to AC inverter within the enclosure. The inverter can have a rated power output at a first temperature disposed within the container. The power system can include a cooling source in thermal communication with the inverter. The inverter can be maintained at a second temperature sufficient to allow the inverter to be overdriven to increase power output by at least 5% over the rated power output. The DC to AC inverter unit within the enclosure can include a power current switch within the enclosure. The switch can switch back and forth to allow current to flow in two alternate directions. The DC to AC inverter unit can include a transformer within the enclosure and electrically connected to the switch. The DC to AC inverter can include at least one cooling air outlet through the enclosure. The DC to AC inverter unit can include at least one cooling air inlet opening through the enclosure. The DC to AC inverter unit can include a cooling air fan connected to the cooling air inlet opening. The cooling air fan can move cooling air from the cooling source into the enclosure through the cooling air inlet opening. The power transformer can include a metal core.

The DC to AC inverter unit can include a cooling air passageway through the interior of the transformer metal core and a transformer cooling air port to allow air to flow through the transformer cooling air passageway. The DC to AC inverter unit can include a smoke detector within the enclosure. The DC to AC inverter unit can include a fused heavy-duty safety disconnect switch within the enclosure. The DC to AC inverter unit can include a non-fused heavy-duty safety disconnect switch within the enclosure. The DC to AC inverter unit can include a ground fault circuit interrupter within the enclosure. The DC to AC inverter unit can include a DC input from a solar module to the DC to AC inverter.

The DC to AC inverter unit can include a supervisory control and data acquisition system within the enclosure. The supervisory control and data acquisition system can include at least one sensor acquiring data on the outputs of the solar cell power system, a human-machine interface, a current/voltage control unit, a computer supervisory system acquiring data from the sensor and sending commands to the current/voltage control unit, a remote terminal unit connecting to the sensor, converting sensor signals to digital data and sending digital data to the supervisory system, and a communication infrastructure connecting the supervisory system to the remote terminal unit. The supervisory control and data acquisition system can include a programmable logic controller used as field device. The DC to AC inverter unit can include at least one opening for cable routing through the enclosure. The DC to AC inverter unit can include a cable vault adjacent to the enclosure. The cooling source can include an air conditioning system to keep the temperature in the enclosure below about 50 degrees C. The air conditioning system can keep the temperature in the enclosure below about 35 degrees C. The air conditioning system keeps the temperature in the enclosure below about 20 degrees C.

Figure 5:
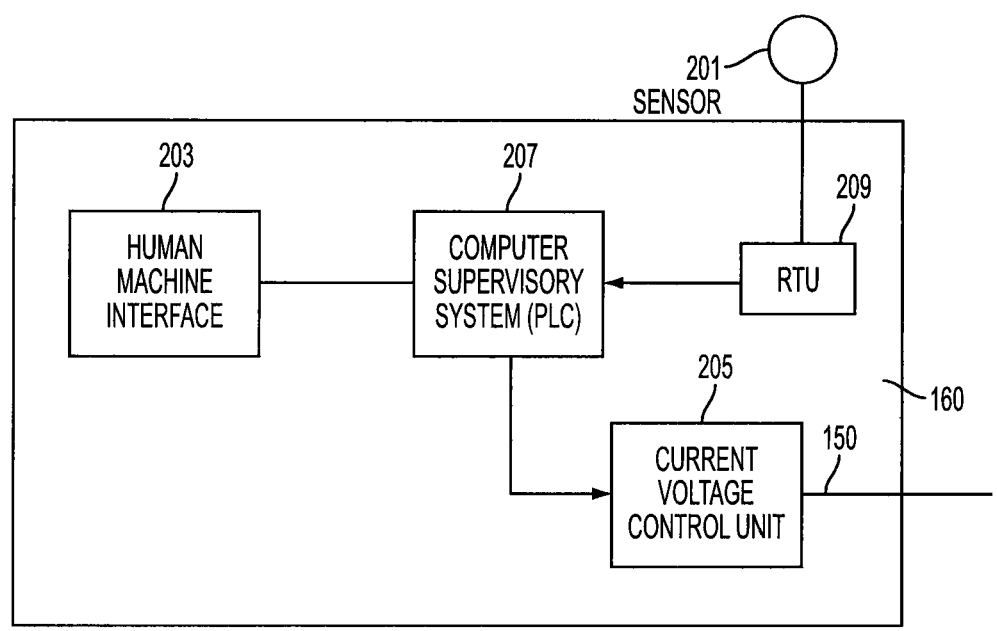
FIG. 5 is a block diagram illustrating details of one example of a controller.

Referring to FIG. 1, solar power system 100 can include photovoltaic or solar array 110. Solar modules 110 can be arranged in any suitable manner, for example, in arrays positioned on the ground or on rooftops. Solar array 110 can include any suitable photovoltaic devices, including thin-film solar devices such as cadmium telluride (CdTe) or Copper Indium Gallium Selenide (CIGS). Alternatively, the photovoltaic devices can be crystalline silicon solar devices or any other suitable photovoltaic devices capable of generating direct current electricity. DC electric current generated by photovoltaic array 110 can output to DC to AC inverter 140 by cable 120. DC to AC inverter 140 can be installed in enclosure 130. Solar power system 100 can include supervisory control and data acquisition (SCADA) system or other control module 160, wherein supervisory control and data acquisition (SCADA) system or other control module 160 can include, as shown in FIG. 5, at least one sensor 201 acquiring data on the outputs of the solar cell power system, a human-machine interface 203, a current/voltage control unit 205, a computer supervisory system 207 acquiring data from the sensor 201 and sending commands to the current/voltage control unit 205, and a remote terminal unit (RTU) 209 connecting to the sensor 201 in the process, converting sensor signals to digital data and sending digital data to the supervisory system 207. Supervisory control and data acquisition (SCADA) system or other control module 160 can connected to inverter 140 with communication cable 150. In certain embodiment, supervisory control and data acquisition (SCADA) system or other control module 160 can include a programmable logic controller (PLC) used as field device because they are more economical, versatile, flexible, and configurable than special-purpose remote terminal unit (RTU). Solar power system 100 can further include a ground fault circuit interrupter (GFCI) within the enclosure.

Figure 2:
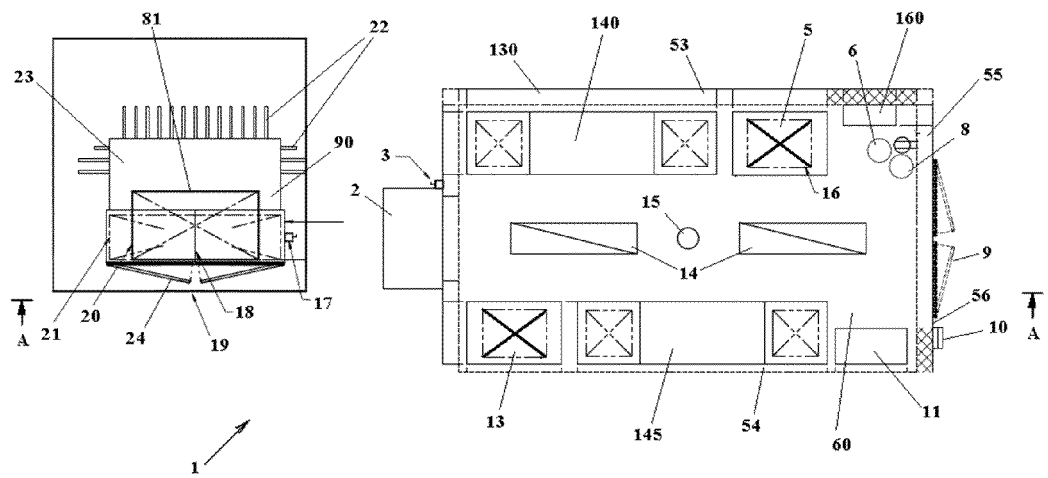
FIG. 2 is a top view of an arrangement of a DC to AC inverter used in a solar cell power system.
Figure 2A:
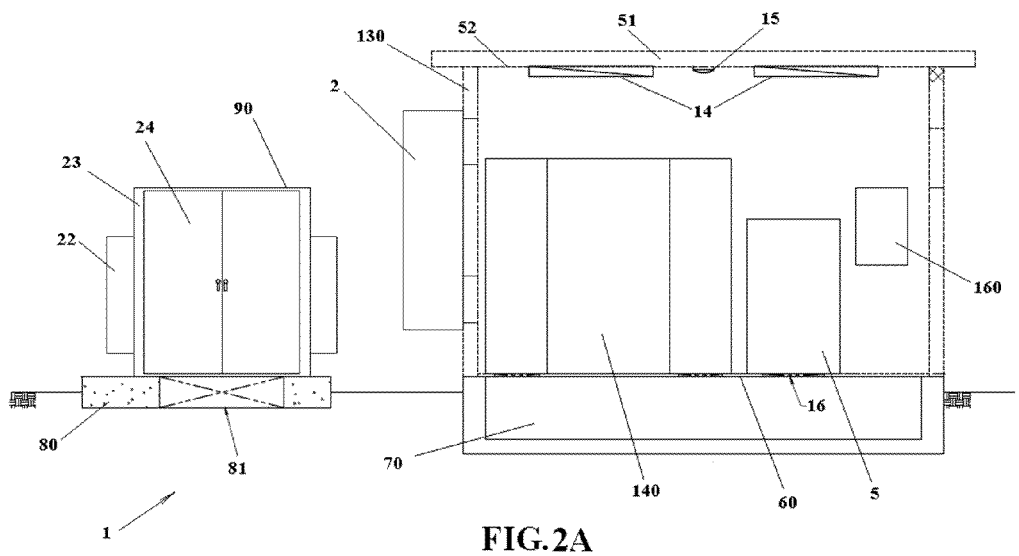
FIG. 2A is a cross-section view taken along line A-A in FIG. 2.

Referring to FIG. 2, a top view of DC to AC inverter unit 1 is shown. Referring to FIG. 2A, a cross-section view of DC to AC inverter unit taken along line A-A in FIG. 2, is shown. Inverters 140 and 145 can be positioned separately within enclosure 130. Enclosure 130 can be any suitable type of enclosure. For example, enclosure 130 can be a concrete enclosure or metal enclosure, such as a metal container similar to a metal shipping container and sharing characteristics with an intermodal transport unit (ITU). Enclosure 130 can have any suitable dimensions. For example, enclosure 130 can have a length of about 10 feet to about 20 feet. Enclosure 130 can have a length of about 15 feet. Enclosure 130 can have a rectangular shape from above and therefore can have a width shorter than its height. For example, the width can be about 8 feet to about 10 feet. The width of enclosure 130 can be about 9 feet, 6 inches. Enclosure 130 can also have a rectangular shape when viewed from the side. Therefore, the height of enclosure 130 can be less than its length. Enclosure 130 can have a height of about 8 feet to about 10 feet. Enclosure 130 can include a door 9 in wall 55, or any other suitable location. Enclosure 130 can have a floor 60 and a top plate or roof 51 having an inner surface 52 at the interior of enclosure 130.

Inverter 140 can be positioned along a first side wall 53 of enclosure 130 and inverter 145 can be positioned along a second side wall 54 of enclosure 130. Inverters 140 and 145 can be any suitable inverter, such as a solid-state inverter of any suitable output. For example, inverters 140, 145 can each be an inverter of suitable output (for example, about 500 kW) mounted on floor 60 of enclosure 130. Inverters 140, 145 can include a rated power output (e.g. a nameplate rating such as a maximum temperature rating) at which inverters 140, 145 can be operated. The rated power output can disclose a power output number (for example, about 500 nominal 500 kW) that can be expected to be obtained at a certain operating temperature, which can be a maximum temperature. For example, the operating temperature or maximum temperature rating can be about 50 degrees C. Inverters 140, 145 can each have a DC side which can be electrically connected to a DC power source such as a solar module array 110 (FIG. 1). DC fuse boxes 5, 13 can be provided adjacent to inverters 140, 145 and between inverters 140 and 145 and their respective DC power sources. Cables connecting DC fuse boxes 5, 13 can be run through bottom opening 16 in floor 60, through cable vault 70 below floor 60 of enclosure 130.

Power panel 11 and SCADA panel 160 can be positioned in any suitable location in or around enclosure 130. For example, power panel 11 and SCADA panel 160 can be located inside enclosure 130. Power panel 11 and SCADA panel 160 can be mounted on opposite walls 53 and 54 of enclosure 130 respectively.

Interior of enclosure 130 can include suitable lighting units 14 to illuminate the interior. For example, lights 14 can be any appropriate lighting unit. For example, lights 14 can be low-profile fluorescent fixtures, each having two fluorescent light bulbs. Lights 14 can be 120 volts AC electronic ballast lamp. Light 14 can be a low-temperature light (such as a fluorescent) to help maintain a cool temperature of the interior of enclosure 130. Interior of enclosure 130 can also include any other instrumentation or warning as desired. For example, enclosure 130 can include a smoke detector 15. Smoke detector 15 can be 120-volt AC direct wire ionization smoke detector with remote interface relay module. Lights 14 and smoke detector 15, along with any other suitable appliances or instruments, can be attached to inner surface 52 of top plate 51 of enclosure 130, or any other suitable location.

Enclosure 130 can include a cooling source 2 adjacent to a wall or surface of enclosure 130. For example, cooling source 2 can be positioned on an outside surface of a wall of enclosure 130. Cooling source 2 can be in thermal communication with inverters 140, 145 positioned in the interior of enclosure 130. That is, cooling source 2 can be configured to cool the interior of enclosure 130. For example, cooling source 2 can be a heating ventilating air conditioning unit (HVAC) and/or air conditioning unit positioned adjacent to at least one cooling air inlet opening such that cool air is directed from cooling source 2 into the interior of enclosure 130. To facilitate the flow of cool air through enclosure 130, enclosure 130 can also include a cooling air outlet, and a cooling air fan connected to the cooling air inlet opening, wherein the cooling air fan moves cooling air into the enclosure through the cooling air inlet opening. In this manner, cooling source 2 can maintain a decreased operating temperature in enclosure 120 such that the output of inverters 140, 145 will be at least about 5% (and possibly 20% or more) improved over the output at the operating temperature disclosed on the nameplate rating (for example, a maximum temperature disclosed in a maximum temperature rating) of inverters 140, 145. This increased output can be obtained by maintaining a temperature, for example of about 35 degrees C. or lower. The temperature of interior of enclosure 130 can be maintained at about 20 degrees C. or lower.

Ground fault circuit interrupter (GFCI) 8 and AC toggle single-pole switch 6 can included adjacent to SCADA panel 160 within enclosure 130. AC toggle single-pole switch 6 can be a heavy-duty industrial type 120-volt AC, 20 A switch. Ground fault circuit interrupter (GFCI) 8 can be heavy-duty commercial grade 120-volt AC, 20 A one. Heavy-duty no-fused safety disconnect switch 3 can be attached to enclosure 130 adjacent to HVAC unit 2. Wall pack fluorescent fixture 10 can be attached to outer surface 56 of wall 55. Wall pack fluorescent fixture 10 can include a 26 to 42 W compact fluorescent lamp. The lamp can be solar cell controlled.

As shown in FIGS. 2 and 2A, inverter unit 1 can include transformer 23 positioned adjacent to enclosure 130 on base 80. Transformer 23 can be any suitable transformer, including a pad-mounted variety as shown in FIGS. 2 and 2A. Transformer 23 can be pad-mounted transformer supplied by Cooper Power Systems and suitable for connecting to inverters 140, 145. Transformer 23 can include bottom opening 21 for cable routing and an outer transformer enclosure 90. Transformer 23 can include transformer steel divider plate 18. Heavy-duty fused safety disconnect switch 17 can be positioned adjacent to transformer 23. Switch 17 can include 3 40 A fuses. Transformer 23 can be mounted on precast transformer pad 19. Precast transformer pad 19 can include precast pad cable slot 20 for cable routing. Base 80 can include opening 81 for cable routing. During installation, bottom opening 21 of transformer 23 should be aligned with opening 81 of base 80. Fin heat sink 22 can be included and positioned in thermally conductive relationship with transformer 23. Enclosure 90 can include door or opening 24.

Figure 3:
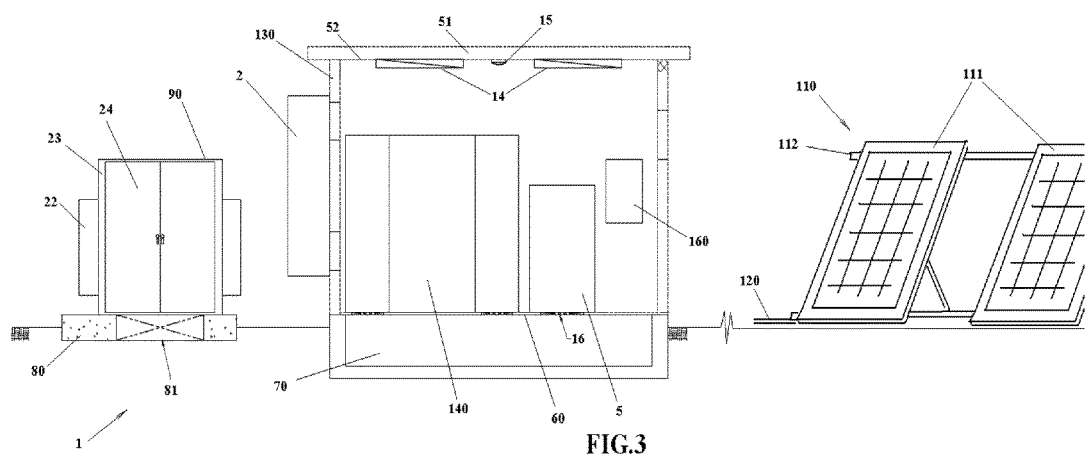
FIG. 3 is a perspective view of a solar cell power system including a photovoltaic array and a DC to AC inverter unit.

Referring to FIG. 3, solar power system 100 can include photovoltaic array 110 and DC to AC inverter unit 1. Photovoltaic array 110 can include plurality of photovoltaic modules 111 and photovoltaic module mounting frame work 112. DC to AC inverter unit 1 can include inverters 140 positioned within enclosure 130 and transformer 23 positioned adjacent to enclosure 130 on base 80. DC electric current generated by photovoltaic array 110 can output to DC to AC inverter 140 by cable 120. DC to AC inverter unit 1 can include a cooling source in thermal communication with the inverter, an air conditioning system, a fin heat sink or any other suitable means to maintain the inverter a temperature sufficient to increase output by at least 5% over the output at the maximum temperature rating.

Figure 4:
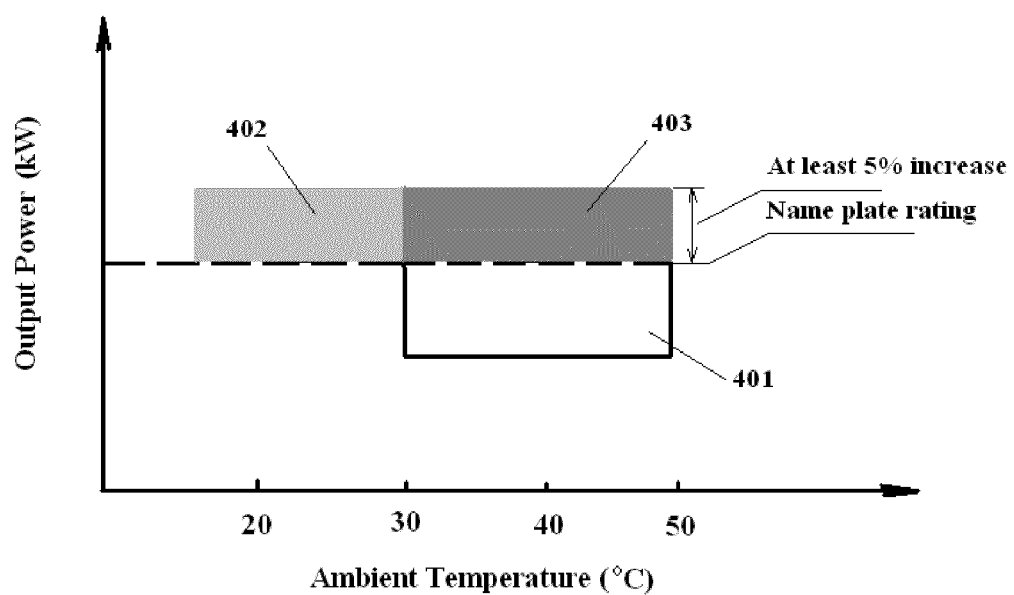
FIG. 4 is a diagram illustrating the inverter overdrive.

FIG. 4 includes a graphical representation of how an inverter can be overdriven in accordance with the present invention by changing the typical cooling control loops to be driven by both temperature and load. Overdrive means the inverter can be maintained at a lower temperature to allow the inverter to expand power output capacity higher than the rated power output capacity. This invention allows overdrive to be enabled as much as possible without the need for air conditioning. Air conditioning can be activated, for example, only during the simultaneous conditions of load and temperature limits being exceeded. Normal operation region 401 represents the cases that the unit can still run without air conditioning if the load of the inverter is less than 100%. Free overdrive region 402 represents the cases that the unit can still be overdriven without turning on air conditioning. This would cover "clipping" period (a relatively cool temperature, but sunshine sufficient to generate power in excess of the rated inverter output disclosed, for example, in the nameplate rating) without the need of air conditioning. Forced overdrive region 403 represents the cases that the unit can only possibly be overdriven by using air conditioning. With an external cooling source being used as a means of lowering the "ambient" temperature surrounding the inverter, the inverter can operate at a rating above its nameplate rating in region 403. The external cooling source can be an air conditioning module, an air circulation module, or any suitable means of lowering the "ambient" temperature.

The increased inverter output obtainable by the present invention can result in various unexpected efficiencies. First, as described above, selective overdriving of inverters can result in capturing of previously wasted photovoltaic array output during "clipping" period. Also, fewer inverters can be overdriven as necessary to equal the combined output of a greater number of inverters driven strictly in accordance with the nameplate rating. Additionally, smaller capacity inverters can be overdriven to equal the output of an equal number of larger capacity (according to nameplate rating) inverters.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A DC to AC inverter unit comprising:
an enclosure;
a DC to AC inverter within the enclosure, the inverter having a rated power output at a first temperature; and
a cooling source in thermal communication with the inverter,
wherein the cooling source is configured to maintain the inverter at or below a second temperature sufficient to allow the inverter to be overdriven to increase power output by 5% or more over the rated power output in response to detected load and temperature conditions.

2. The DC to AC inverter unit of claim 1, further comprising a power current switch within the enclosure, wherein the switch switches back and forth to allow current to flow in two alternate directions.

3. The DC to AC inverter unit of claim 2, further comprising a transformer within the enclosure and electrically connected to the switch.

4. The DC to AC inverter unit of claim 1, further comprising a DC input from a photovoltaic array to the DC to AC inverter.

5. The DC to AC inverter unit of claim 4, further comprising a supervisory control and data acquisition system within the enclosure, wherein the supervisory control and data acquisition system comprises:
at least one sensor acquiring data on the outputs of the photovoltaic array;
a human-machine interface; a current/voltage control unit;
a computer supervisory system acquiring data from the sensor and sending commands to the current/voltage control unit;
a remote terminal unit connecting to the sensor, converting sensor signals to digital data and sending digital data to the supervisory system; and
a communication infrastructure connecting the supervisory system to the remote terminal unit.

6. The DC to AC inverter of claim 5, wherein the supervisory control and data acquisition system comprises a programmable logic controller used as field device.

7. The DC to AC inverter unit of claim 1, further comprising a cable vault adjacent to the enclosure.

8. The DC to AC inverter unit of claim 1, wherein the cooling source comprises an air conditioning system.

9. The DC to AC inverter unit of claim 1, wherein the first temperature is about 50 degrees C. and the second temperature is about 35 degrees C.

10. The DC to AC inverter unit of claim 1, wherein the first temperature is about 50 degrees C. and the second temperature is about 20 degrees C.

11. A method for generating AC power, comprising:
operating in an enclosure an inverter having a rated power output, the inverter comprising a power current switch and the power current switch being electrically connected to a power transformer;
maintaining a first temperature within the enclosure; and
in response to detecting temperature and load conditions of the inverter, maintaining at or below a second temperature within the enclosure, such that the second temperature permits overdriving the inverter to output power greater than the rated power output.

12. The method of claim 11, wherein maintaining the second temperature within the enclosure comprises operating a cooling source thermally connected to the inverter to permit the overdriving.

13. The method of claim 11, further comprising dissipating heat from the transformer using a finned heat sink in thermal connection with the transformer.

14. The method of claim 11, further comprising dissipating heat from the power switch using a finned heat sink in thermal communication with the power switch.

15. A photovoltaic module-based power system comprising:
a photovoltaic array; and
a DC to AC inverter unit electrically connected to the photovoltaic array comprising:
an enclosure;
a DC to AC inverter within the enclosure, the inverter having a rated power output at a first temperature; and
a cooling source in thermal communication with the inverter,
wherein the cooling source is configured to maintain the inverter at or below a second temperature sufficient to allow the inverter to be overdriven to increase power output by 5% or more over the rated power output in response to detected load and temperature conditions.

16. The photovoltaic module-based power system of claim 15, further comprising a supervisory control and data acquisition system within the enclosure, wherein the supervisory control and data acquisition system comprises:
at least one sensor acquiring data on the outputs of the photovoltaic array;
a human-machine interface;
a current/voltage control unit;
a computer supervisory system acquiring data from the sensor and sending commands to the current/voltage control unit;
a remote terminal unit connecting to the sensor, converting sensor signals to digital data and sending digital data to the supervisory system; and
a communication infrastructure connecting the supervisory system to the remote terminal unit.

17. The DC to AC inverter unit of claim 1, wherein the cooling source is configured to maintain the inverter at or below the second temperature in response to detecting that a load limit and a temperature limit are simultaneously exceeded.

18. The method of claim 11, wherein detecting temperature and load conditions comprises detecting that a load limit and a temperature limit are simultaneously exceeded.

19. The method of claim 11, wherein the first temperature is about 50 degrees C. and the second temperature is about 35 degrees C.

20. The photovoltaic module-based power system of claim 15, wherein the cooling source is configured to maintain the inverter at or below the second temperature in response to detecting that a load limit and a temperature limit are simultaneously exceeded.

* * * * *